United States Patent [19]

Davies

[11] Patent Number: 5,691,558
[45] Date of Patent: Nov. 25, 1997

[54] DRIFT-FREE AVALANCHE BREAKDOWN DIODE

[75] Inventor: Neil A. Davies, Sonnenbuehl-Genkingen, Germany

[73] Assignee: Robert Bosch GmbH, Stuttgart, Germany

[21] Appl. No.: 505,226

[22] PCT Filed: Dec. 8, 1994

[86] PCT No.: PCT/DE94/01462

§ 371 Date: May 13, 1996

§ 102(e) Date: May 13, 1996

[87] PCT Pub. No.: WO95/17013

PCT Pub. Date: Jun. 22, 1995

[30] Foreign Application Priority Data

Dec. 18, 1993 [DE] Germany ............ 43 43 365.0

[51] Int. Cl.⁶ .................................................. H01L 29/76
[52] U.S. Cl. ....................... 257/367; 257/603; 257/605; 257/606
[58] Field of Search ............................ 257/367, 551, 257/603, 605, 606

[56] References Cited

U.S. PATENT DOCUMENTS

| 5,276,350 | 1/1994 | Merrill et al. ............ 257/603 |
| 5,434,442 | 7/1995 | Lesk et al. ............... 257/367 |

OTHER PUBLICATIONS

Y. Hayashi et al., "Insulated Gate Avalanche Transistor", Japanese Journal of Applied Physics, Supplements, Bd. 43, 1974, Tokyo JA, pp. 437–441.

Patent Abstracts of Japan, vol. 9, No. 240 (E–345) (1963) 26 Sep. 1985 & JPA 60 092 674 (Roomu K.K.) 24 May 1985, Moriwake.

*Primary Examiner*—Minh-Loan Tran
*Attorney, Agent, or Firm*—Kenyon & Kenyon

[57] ABSTRACT

An avalanche breakdown diode includes a p-doped trough in which a highly p-doped region is introduced. In addition to the trough, an n-doped region is introduced, which is underlaid by a p-doped layer. The trough and the p-doped layer define a precisely established interspace. The arrangement is introduced into a p-type substrate. An insulating layer and thereon, in turn, a conductive layer are applied over the region between the trough and the p-doped layer. The conductive layer and the n-doped region are connected to a positive voltage and the highly p-doped region is connected to a negative voltage. A drift of the breakdown voltage is thereby prevented. In addition, the resistance during the breakdown is small due to the defined interspace between the trough and the layer.

5 Claims, 3 Drawing Sheets

DRIFT-FREE AVALANCHE BREAKDOWN DIODE

FIELD OF THE INVENTION

The present invention relates to a diode, in particular a drift-free avalanche breakdown diode. An avalanche breakdown diode constructed on a p-type substrate is already known, the anode being formed by a highly p-doped trough, into which a very highly p-doped region is introduced, and the highly p-doped region being connected to a voltage supply. The cathode is formed by a highly doped n-type region, which is underlaid by a highly p-doped region and is introduced into the p-type substrate. The highly n-doped region is connected to a positive voltage.

SUMMARY OF THE INVENTION

The arrangement according to the present invention has the advantage that the drift of the breakdown voltage is minimized. This is achieved by preventing the breakdown from taking place in the vicinity of the surface of the p-type substrate. The process for producing an avalanche breakdown diode according to the present invention also has the advantage that the p-doped layer and the p-doped trough are automatically adjusted with respect to one another. In this case, the interspace between the highly doped p-type trough and the highly p-doped layer is established exactly by the production process. This leads to a small resistance during the breakdown of the avalanche breakdown diode. Consequently, this avalanche breakdown diode is suitable as an accurate voltage reference. It is particularly advantageous to produce the insulating according to the present invention from silicon oxide. An advantageous selection of the material for the conductive layer according to the present invention is the use of polysilicon.

The avalanche breakdown diode according to the present invention also can be produced advantageously in the form of an inverse conductivity structure, that is to say arranging p-type material instead of n-type material. Consequently, the use of the avalanche breakdown diode is independent of the semiconductor processes used.

DETAILED DESCRIPTION OF THE INVENTION

Figure 1:
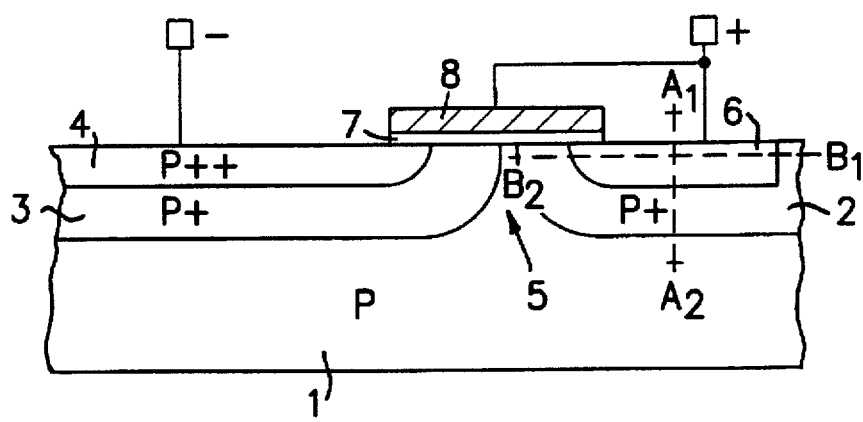
FIG. 1 shows an integrated avalanche breakdown diode according to the present invention.

FIG. 1 shows a p-type substrate 1, into which a highly p-doped trough 3 is introduced. A very highly p-doped first region 4 is arranged in turn in the trough 3. In addition to the trough 3, a highly n-doped second region 6 is introduced. The second region 6 is underlaid by a highly p-doped layer 2. The layer 2 and the trough 3 are separated by an interspace 5 which has a precisely defined width. The interspace 5 is filled by the p-type substrate 1. An insulating layer 7 is arranged over the interspace 5. A conductive layer 8 is applied to the insulating layer 7. The conductive layer 8 and the second region 6 are connected to a second potential, a positive voltage. The first region 4 is connected to a first potential, a negative voltage.

Arranging n-doped material instead of p-doped material, that is to say constructing the avalanche breakdown diode with the aid of an inverse conductivity structure, is self-evident to a person skilled in the art.

In this exemplary embodiment, $1.5 \times 10^{20}$ ions per $cm^3$ were selected for the doping of the highly n-doped second region 6. In this case, the doping depth is $0.4 \times 10^{-6}$ m. A doping of $2 \times 10^{17}$ ions per $cm^3$ was selected for the highly p-doped trough 3 and the highly p-doped layer 2, the doping depth being $1.6 \times 10^{-6}$. The very highly p-doped first region 4 has a doping of $4 \times 10^{19}$ ions per $cm^3$, the doping depth being $0.6 \times 10^{-6}$ m.

The arrangement according to FIG. 1 functions as follows: when a breakdown voltage is applied to the avalanche breakdown diode, the conductive layer 8 is simultaneously connected to the positive voltage, with the result that a high potential does not build up under the conductive layer 8 and therefore a breakdown is prevented in this region. In this arrangement, the breakdown takes place between the second region 6 and the layer 2, in the region where the second region 6 is arranged horizontally on the layer 2. In this way, it is achieved that the breakdown voltage remains constant, irrespective of the current flowing and the voltage applied. Since the breakdown is not produced in the vicinity of a surface layer, oxide charges, which produce long-term impairment of the mode of operation of the avalanche breakdown diode, are prevented from forming.

Figure 2:
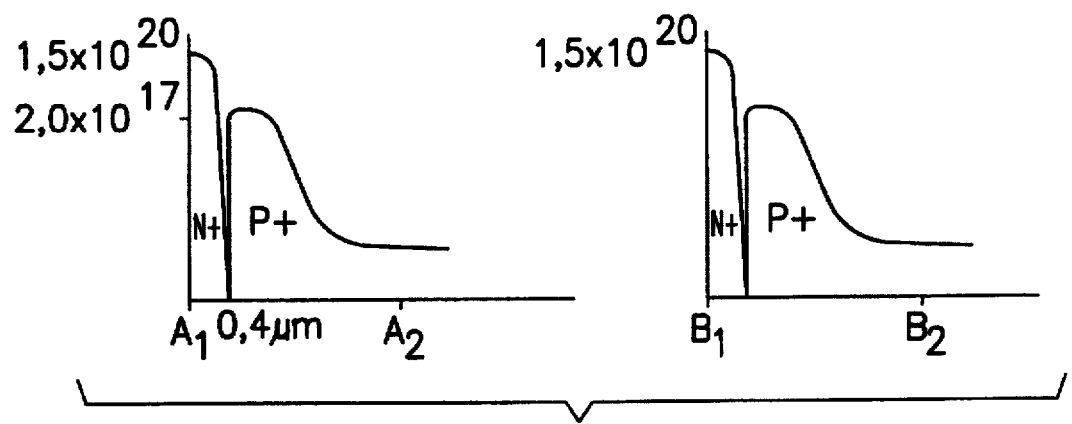
FIG. 2 shows doping profiles according to the present invention.

FIG. 2 shows the characteristic of the doping profiles corresponding to the lines of intersection $A_1-A_2$ and $B_1-B_2$ drawn in FIG. 1, the doping in ions/$cm^3$ being plotted against the line of intersection. On account of the production process used, the doping profile in the vertical direction $A_1-A_2$ is very similar to the doping profile in the horizontal direction $B_1-B_2$. This produces a similar breakdown behavior in the vertical and horizontal directions. Due to the use of the conductive layer 8 and of the corresponding voltage supply of the layer 8, an electric field is produced in the interspace 5, which electric field prevents an avalanche breakdown in the horizontal direction $B_1-B_2$, with the result that the avalanche breakdown diode breaks down in the vertical direction $A_1-A_2$.

Figure 3:
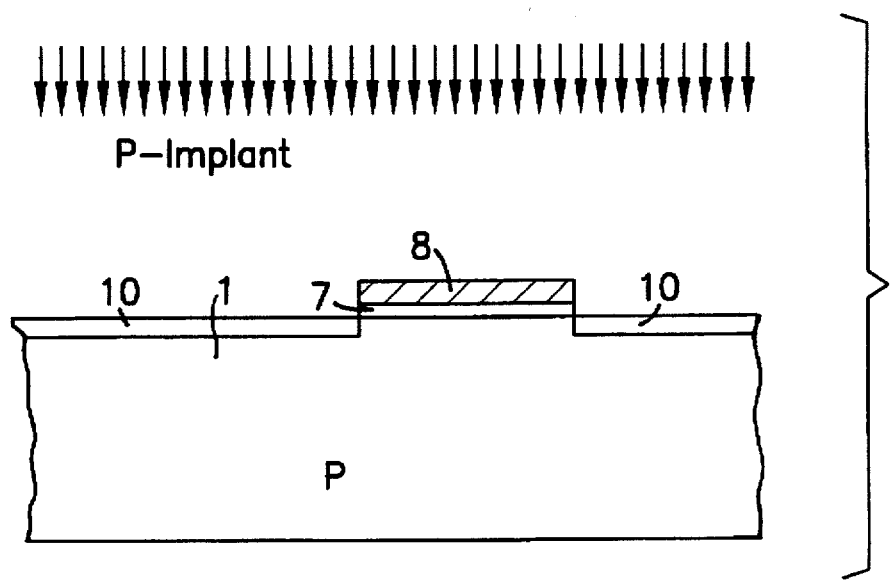
FIG. 3 shows a first ion implantation according to the present invention.
Figure 4:
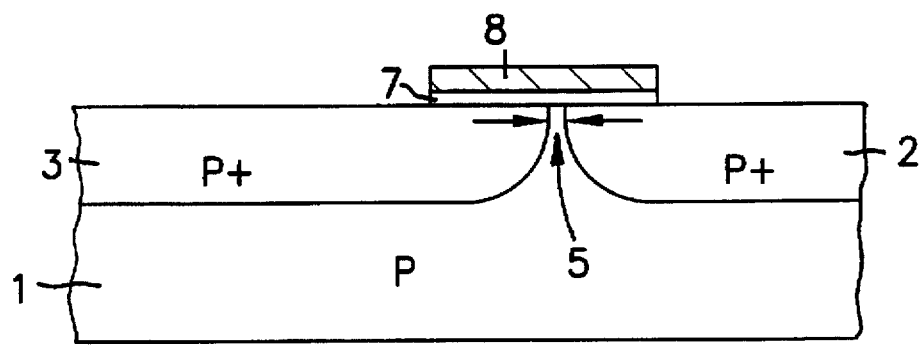
FIG. 4 shows two diffused regions according to the present invention.
Figure 5:
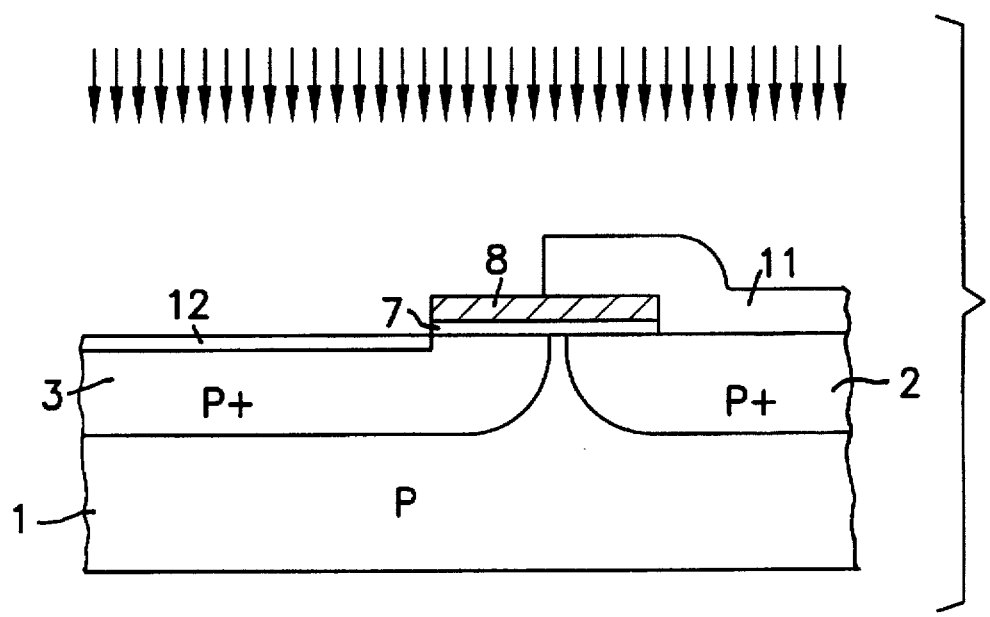
FIG. 5 shows a second ion implantation according to the present invention.
Figure 6:
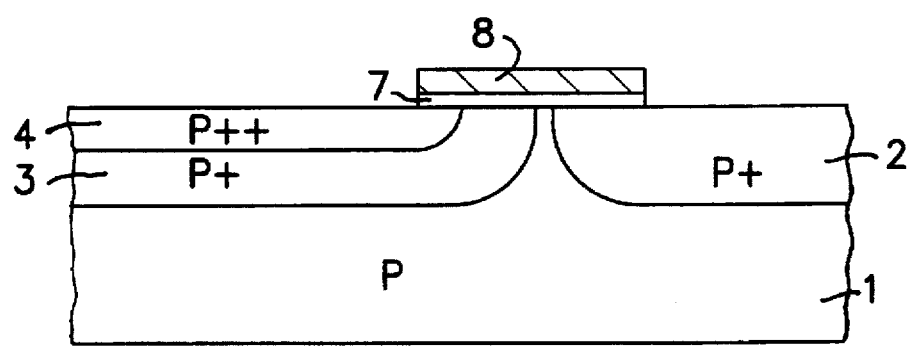
FIG. 6 shows a further diffused region according to the present invention.
Figure 7:
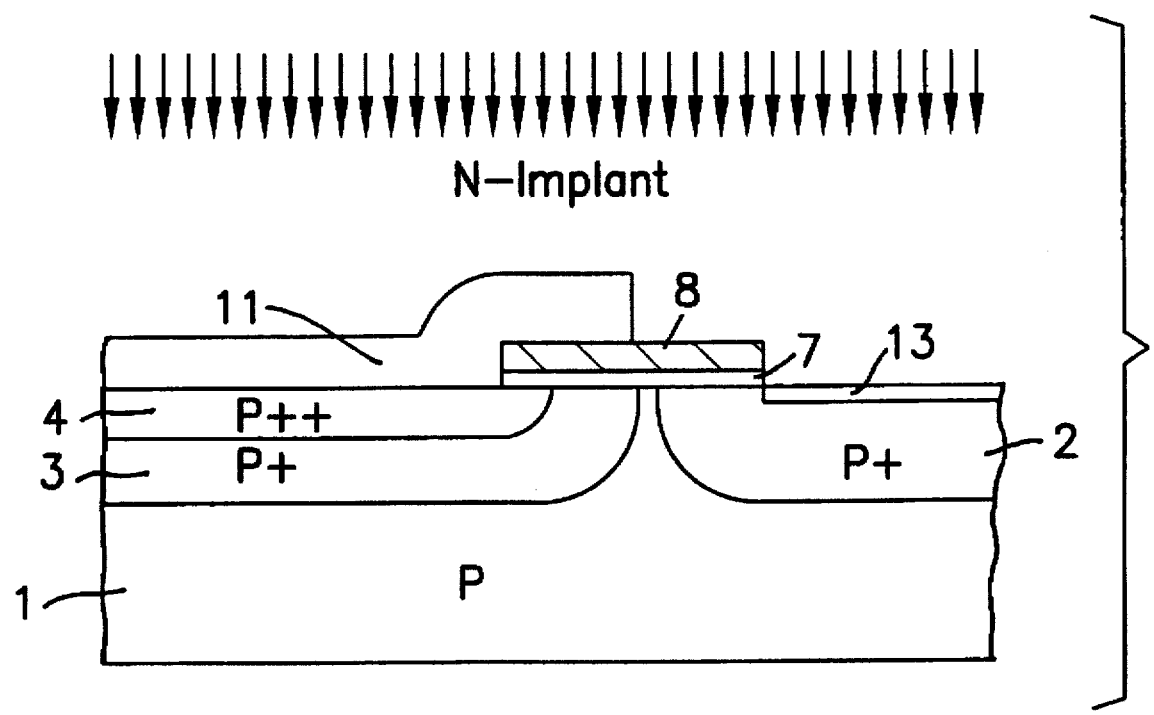
FIG. 7 shows a third implantation according to the present invention.

The avalanche breakdown diode is produced according to a self-adjusting process. The process is explained using FIGS. 3 to 7. For the production, a p-type substrate 1, for example, is used, to which an insulating layer 7 and a polysilicon layer 8 having a defined width are applied. Positively charged ions are implanted into the p-type substrate 1, as is illustrated in FIG. 3. On account of the width of the insulating layer 7 and of the polysilicon layer 8, two positively doped surface layers 10 having a defined separation are obtained. Diffusion then takes place in such a way that a positively doped trough 3 and a positive layer 2 are obtained, which have an established interspace 5 having a defined width under the insulating layer 7, as is illustrated in FIG. 4. Subsequently, the positively doped layer 2 is covered with a photoresist 11 and the trough 3 is doped with positive ions at a higher concentration than in the preceding implantation. Consequently, a second highly positively doped surface layer 12 is obtained, as is illustrated in FIG. 5. Diffusion takes place, with the result that the positively doped first region 4 is obtained, as is illustrated in FIG. 6. Subsequently, the photoresist 11 is removed and the first region 4 is covered with photoresist 11. Implantation with negative ions then follows, with the result that a highly negatively doped surface layer 13 is produced, as is illustrated in FIG. 7. With the aid of diffusion, the highly negatively doped second region 6 according to FIG. 1 is produced. In this way, the avalanche breakdown diode illustrated in FIG. 1 is produced, the width of the interspace 5 between the trough 3 and the layer 2 being precisely established.

What is claimed is:

1. An avalanche breakdown diode having a p-type substrate, comprising:

a first p-doped region formed in the p-type substrate;

a second p-doped region formed in the first p-doped region, the second p-doped region having a doping concentration greater than the first p-doped region;

a n-doped region formed in the p-type substrate;

a third p-doped region formed underneath the n-doped region, the third p-doped region and the first p-doped region defining an interspace having a predetermined width and including the p-type substrate, the third p-doped region covering at least a portion of the n-doped region adjacent to the interspace;

an insulating layer formed over the interspace;

a conducting layer applied to the insulating layer; and wherein the second p-doped region is connected to a negative voltage, the n-doped region is connected to a positive voltage and the conductive layer is connected to the positive voltage.

2. The avalanche breakdown diode according to claim 1, wherein the first p-doped region is formed as a trough.

3. The avalanche breakdown diode according to claim 1, wherein the insulating layer includes silicon oxide.

4. The avalanche breakdown diode according to claim 1, wherein the conductive layer includes polysilicon.

5. An avalanche breakdown diode having an n-type substrate, comprising:

a first n-doped region formed in the n-type substrate;

a second n-doped region formed in the first n-doped region, the second n-doped region having a doping concentration greater than the first n-doped region;

a p-doped region formed in the n-type substrate;

a third n-doped region formed underneath the p-doped region, the third n-doped region and the first n-doped region defining an interspace having a predetermined width and including the n-type substrate, the third n-doped region covering at least a portion of the p-doped region adjacent to the interspace;

an insulating layer formed over the interspace;

a conducting layer applied to the insulating layer; and wherein the second n-doped region is connected to a positive voltage, the p-doped region is connected to a negative voltage and the conductive layer is connected to the negative voltage.

* * * * *

UNITED STATES PATENT AND TRADEMARK OFFICE
CERTIFICATE OF CORRECTION

PATENT NO. : 5,691,558

DATED : November 25, 1997

INVENTOR(S) : Davies, Neil

It is certified that error appears in the above-identified patent and that said Letters Patent is hereby corrected as shown below:

Column 1, line 7, after "diode." a new paragraph should begin and insert

--BACKGROUND INFORMATION--

Column 1, line 7, "An......." should begin a new paragraph after

BACKGROUND INFORMATION.

Column 2, line 19, "$1.6 \times 10^{-6}$." should be -- $1.6 \times 10^{-6}$m.--.

Signed and Sealed this

Twentieth Day of July, 1999

Attest:

Q. TODD DICKINSON

Attesting Officer     Acting Commissioner of Patents and Trademarks